United States Patent [19]

Myers et al.

[11] 3,723,053

[45] Mar. 27, 1973

[54] HEAT TREATING PROCESS FOR SEMICONDUCTOR FABRICATION

[75] Inventors: Charles F. Myers, Scottsdale, Ariz.; Sandford Platter, Bolton, Mass.

[73] Assignee: Robert L. Jarratt, Trustee in Bankruptcy for Semiconductor Electronic Memories Inc., by said Myers and Platter

[22] Filed: Oct. 26, 1971

[21] Appl. No.: 192,271

[52] U.S. Cl. ..........................432/6, 148/1.5, 432/11, 432/45

[51] Int. Cl. ..............................F27b 9/00, F27b 9/14

[58] Field of Search................263/52, 47, 48, 41, 42; 148/1.5

[56] References Cited

UNITED STATES PATENTS

| | | | |
|---|---|---|---|
| 3,620,520 | 11/1971 | Ross et al. | 263/52 |
| 3,461,547 | 8/1969 | DiCurcio | 148/1.5 |

*Primary Examiner*—John J. Camby
*Assistant Examiner*—Henry C. Yuen
*Attorney*—Lindenberg, Freilich & Wasserman

[57] ABSTRACT

A method and means for heat treating semiconductor material used in diffusion processes or in any semiconductor fabrication process, when the temperature of the semiconductor material exceeds its plastic temperature, for minimizing stresses caused by temperature gradients in the material whereby a number of harmful dislocations, which result in undesired electrical characteristics for the semiconductor circuits on the wafer are eliminated.

7 Claims, 5 Drawing Figures

INVENTORS
SANFORD PLATTER
CHARLES F. MYERS
BY Lindenberg, Freilich & Wasserman
ATTORNEYS

HEAT TREATING PROCESS FOR SEMICONDUCTOR FABRICATION

FIELD OF THE INVENTION

This invention relates to an improved method and means for processing semiconductor materials, and more particularly to an improvement in the heat treatment thereof.

In the semiconductor fabrication process where, for example, it is desired to deposit a large number of semiconductor memory cells on a wafer, one of the problems presently facing the industry is that the yield per wafer is very low. That is, an average yield on the order of 3 – 5 percent of usable memory cells is obtained. Obviously, it is desirable to increase this yield since not only is the material and labor cost high, but also the amount of electronics required to utilize the acceptable memory cells is increased, with an increase in the number of wafers required to produce a semiconductor memory having a required capacity. Also, with a low yield per wafer, the desired reduced size which can be obtained for semiconductor memories becomes limited.

OBJECTS AND SUMMARY OF THE INVENTION

An object of this invention is to provide a heat treating process whereby the yield of integrated circuits through the semiconductor fabrication process is increased.

Another object of this invention is the provision of a novel heating method and means for utilization in semiconductor fabrication whereby the yield is increased.

These and other objects of the invention are achieved by arranging to heat semiconductor materials in a manner or at a rate so that thermal stresses, at temperatures which exceed the plastic temperature of the semiconductor material, are either minimized or eliminated. This is accomplished by determining the critical temperature gradient that causes stress above the yield point of the material, and controlling both the rate of heating and cooling so that the temperature gradient is lower than the critical temperature gradient. This can be done by either controlling the rate of change of furnace temperature, or by controlling the area over which the wafer is being heated and/or cooled, or by controlling the length of the path from where the wafer is being heated or cooled, to the center of the wafer.

The novel features of the invention are set forth with particularity in the appended claims. The invention will best be understood from the following description when read in conjunction with the accompanying drawings.

DESCRIPTION OF THE PREFERRED EMBODIMENTS

One of the yield loss factors in manufacturing bipolar integrated circuits is due to a defect that manifests itself as a low value resistance between the collector and the emitter of a transistor. This is commonly known as a pipe. There are several different mechanisms that will generate this defect. However, now that silicon crystal pulling technology has advanced to the point where typical crystal diameters are 2 inches to 2 ¼ inches, the major mechanism that generates the pipe defect is due to processes where the thermal stresses exceed the yield point of silicon.

The dislocations generated by thermal stress may act as sites for impurities within the silicon to nucleate. Impurities such as Au, Fe, Cu etc. can migrate to the dislocation to relieve part of the lattice strain. These foreign atoms can cause poor electrical characteristics.

In accordance with this invention it has been determined that thermal stress which causes defects can be avoided if the rate at which the wafer material, such as silicon, is heated or cooled, above the material plastic deformation temperature, is less than a critical rate.

Figure 1:
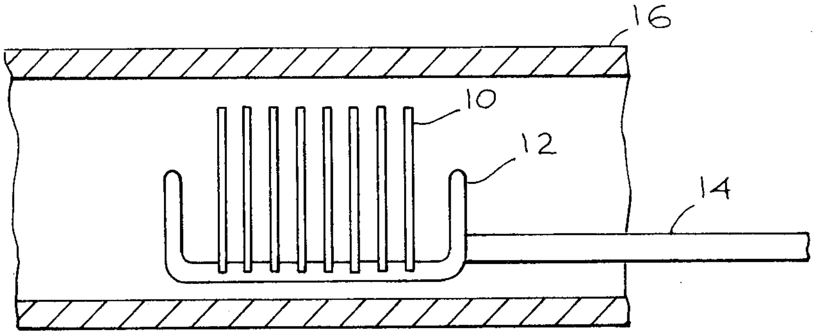
FIG. 1 is a schematic illustrative of the inner lining of a furnace with a boat filled with wafers being pushed therethrough.

Any semiconductor material wafer will have a temperature gradient when being heated or cooled, due to its thermal time constant. This can be thought of as consisting of; the resistance of getting heat into or out of the wafer; the thermal diffusivity of the material; the thermal conductivity of the material; the dimensions of the wafer (thickness in radius); the rate at which heat is being put in or taken out of the wafer; and how the heat is being put into or taken out of the wafer. The most common case is where the wafers are in a boat at close spacing. This is shown in FIG. 1 which is a cross section of a furnace tube with a boat and wafers therein. The wafers 10 are stood up on edge in the boat 12. The boat is pushed by means of a rod 14, for example, through the cylindrical opening in the furnace wall 16 of a diffusion furnace.

The space between the wafers is minimized to get the maximum throughput. When the semiconductor wafers are held in the manner shown, and heated to relatively high temperatures, such as in a typical diffusion furnace, the wafer may be considered as being heated on its outer edge.

With the wafer being heated or cooled via its outer edge to the center of the wafer, and also, as is the case in present technology, when the wafer is placed in the high temperature environment by being pushed into the furnace at a high rate, such as 0.2 to 5 minutes, to go from room temperature to furnace temperature, a large temperature gradient will occur in the wafer. The path of heat flow is from the outer edge of the wafer to the center. The actual temperature gradient depends on the material of the wafer, the wafer dimensions, the furnace temperature, and very particularly the wafer spacing and the rate at which the wafer environment temperature changes. In the presently known technology, the temperature gradient caused in the wafer by the heating process described results in stresses exceeding the yield point with large amounts of crystal damage. The crystal damage can be evaluated by a technique known as SIRTL etch techniques. This is a well known process wherein after heat treatment the crystal is etched and then looked at by a metalurgical microscope.

There follows a list of the necessary conditions for crystal damage and a definition of terms.

$\sigma_T$ - Stresses caused by temperature gradient $\sigma_{yp}$ - Yield point stress $T_f$ - Furnace (environment) temperature (can vary with length in furnace, or with time)

d$T$/d$R$ - Temperature gradient in wafer from outer edge to center $Tw$ - Temperature of the wafer $dT/dh$ - Temperature gradient in wafer from outer side surface to center $h$ - Thickness of wafer $R$ - Radius of wafer (dT)/(dR)crit - The temperature gradient that will cause stress above the yield point $T_p$ - The temperature at which the material will become plastic at some applied stress (dTf)/dt - Variation of furnace temperature with time (rate of change of the furnace temperature)

(dTf)/dx - Variation of furnace temperature with length of furnace $y$ - Wafer spacing $v$ - Boat (wafer) speed To have no stresses above $\sigma yp$.

$dT/dR < (dT)/(dR)\text{crit when } Tw \geq Tp$ and $dT/dh < (dT)/(dR)\text{crit}$ Basically, what can be controlled in the heating (cooling) process is:

1. The rate of heating; and since the resistance to heating (cooling) of the wafer in the furnace is basically fixed; this means control of the rate of change of the furnace (wafer environment) temperature.
2. The area in which the wafer is being heated (cooled).
3. The length of the path from where the wafer is being heated (cooled) to the center of the wafer.

When the wafers are spaced closely together on edge, as is the custom, then adjacent wafers effectively serve to prevent the heating environment of the furnace from reaching the sides of the wafer. That is why the wafers are said to heat up through their edges. In order to have a maximum d$T_f$/dt then the wafer should be heated from its side (one or both) rather than edge. This makes the distance from the heated surface to the center the thickness of the wafer ($h$). In most cases, h is very small compared to the distance from the edge of the wafer to the center, which can be called $R$. Therefore, a large $dT_f/dt$ can be applied without the D$T$/d$h$ > (d$T$)/(d$R$)crit. For example, when ($h$) is less than 0.025 inches, and using silicon, d$T_f$/d$t$ can be 5000° C/min. without d$T$/d$h$ > ($dT$)/(d$R$)crit · d$T$/dR crit can be calculated or can be determined emperically by heating specimens at different rates and then applying the pipe test to determine which rate causes dislocations.

One way to heat or cool a wafer on its sides is obvious, that is to put one wafer at a time through the heating process. However, obviously commercially this technique has no value.

A better way is to use the effect that for a wafer of any radius, there is a critical wafer spacing, where at such a spacing or greater, the wafer will be heated on its side. The critical spacing is a function of the wafer radius ($R$). It has been determined as $y_{crit}$ = 0.266 R.

For example, a silicon wafer of $R$ = 1.125 at a spacing of 0.30 inches can withstand a d$T_f$/dt = 5000°C/min., since the heating occurring with this wafer spacing is mainly on the sides. Accordingly, by spacing the wafer shown in FIG. 1 a distance exceeding 0.266 $R$, a critical temperature gradient is avoided and so is crystal damage due to thermal stress.

In order to have a maximum number of wafers, or to increase the throughput, a close wafer spacing is used. This of course produces the problem that the wafer heating is through the edges only. However, even with this, for a given material and wafer geometry, there is a maximum d$T_f$/d$t$ that will result in a d$T$/d$R$ < d$T$/d$R$ crit. To obtain this, the wafer temperature change with respect to time must be held below the critical value. The exact value has to be calculated for the particular material and wafer size. For example, a silicon wafer having a radius of 1.125 inches can take a d$T_f$/dt = 50° C/min at a distance of $y$ = 0.06 inches. In other words, as the spacing of the wafers is made less, the change in temperature with respect to time that the wafer is made to undergo is decreased to avoid exceeding the critical rate of temperature change.

As the wafer spacing is increased to $y_{crit}$, the values of d$T_f$/d$t$ that will keep d$T$/d$R$ < (d$T$)/d$R$)crit increases. Therefore the wafer spacing can be varied to increase the speed of temperature change while maintaining the required number of wafers per inch and having no crystal damage. For example, where there is a spacing $y$ = 0.15 inches, the silicon wafer $R$ = 1.125 can take temperature gradient of 100° C/min without crystal damage.

Figure 2:
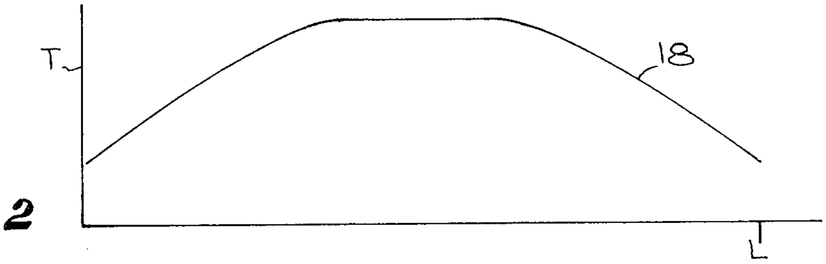
FIG. 2 is a graph illustrating the temperature profile in a diffusion furnace.

FIG. 2 shows a curve 18 which illustrates the temperature profile encountered in passing from the beginning to end of a furnace having a length L. This is what is called a fixed temperature profile furnace.

If it is desired to move the boat carrying wafers through a temperature furnace with a fixed temperature profile, at optimum speed, without temperature caused crystal damaging occurring, then the wafers and the boat should be soaked at some temperature just below the plastic deformation temperature $T_p$ until they reach that temperature. This can be done with an extension just outside the furnace at a zone at the entrance of the furnace where $T_f = T_p - \delta$.

Thereafter the boat is moved into the oven toward the process zone at such a speed that:

$$(dT_f)/(dx)\text{max.}\,(V) \leqq dT_f/dt \text{ such that } dT/dR < (dT)/(dR)\text{crit}$$

For example, given a boat with silicon wafers having $R$ = 1.125, going into a furnace where $T_f$ goes from 600° C to 1100° C in 20 inches, the following speeds are stress free and hence no crystal damage appears, as determined by measurement of dislocation density by the Sirtl etch method.

| SPACING (y) (INCHES) | V (INCHES/MIN) |
|---|---|
| .06 | 2.0 |
| .15 | 4.0 |
| .30 | 200 |

Note: It is important that the steps described for heating should be performed in reverse, for cooling. An extension should be maintained outside of the furnace, or a zone, where the boats exit, for the purpose of bringing the temperature of the wafers from the plastic temperature $T_p$ within the oven down to a temperature just below $T_p$.

Another way to increase the temperature in the wafer while maintaining the temperature increase below the critical value is to vary the speed at which the boat is moved. This can be done by first bringing the wafer up to a temperature below the plastic deformation temperature in an extension just outside the furnace or in a zone at the entrance of the furnace, as indicated above. Thereafter, the boat speed should be matched at any position in the furnace to the temperature profile of the furnace such that at any point in the furnace $$(dT)/(dx)x\,(V)_x \leqq dT_f/dt \text{ such that } dT/dR < (dT)/(dR)\text{crit}$$

as the boat goes through the processing zone. This can be done by either constantly varying $V$ where $V$ is a function of $x$ or by having two or more $V$'s for different regions of the furnace. In removing the boat from the oven the velocities should be reversed to what they were when the boat is introduced into the oven.

Another way of controlling the boat speed so that the temperature gradient in the wafer material does not exceed the critical value above the plastic deformation temperature is to maintain a feedback control whereby the boat speed can be increased or decreased as required to maintain the rate of heating of the wafer material below the critical rate. This can be done by measuring the value of $(dT)/(dR)$ at both ends and at the center of the boat. That is, the wafers at the two outside ends and in the center of the boat have these temperatures measured. The temperature $(dT)/(dR)$ equals the temperature of the wafer at the edge minus the temperature of the wafer at the center.

Figures 3, 4, 5:
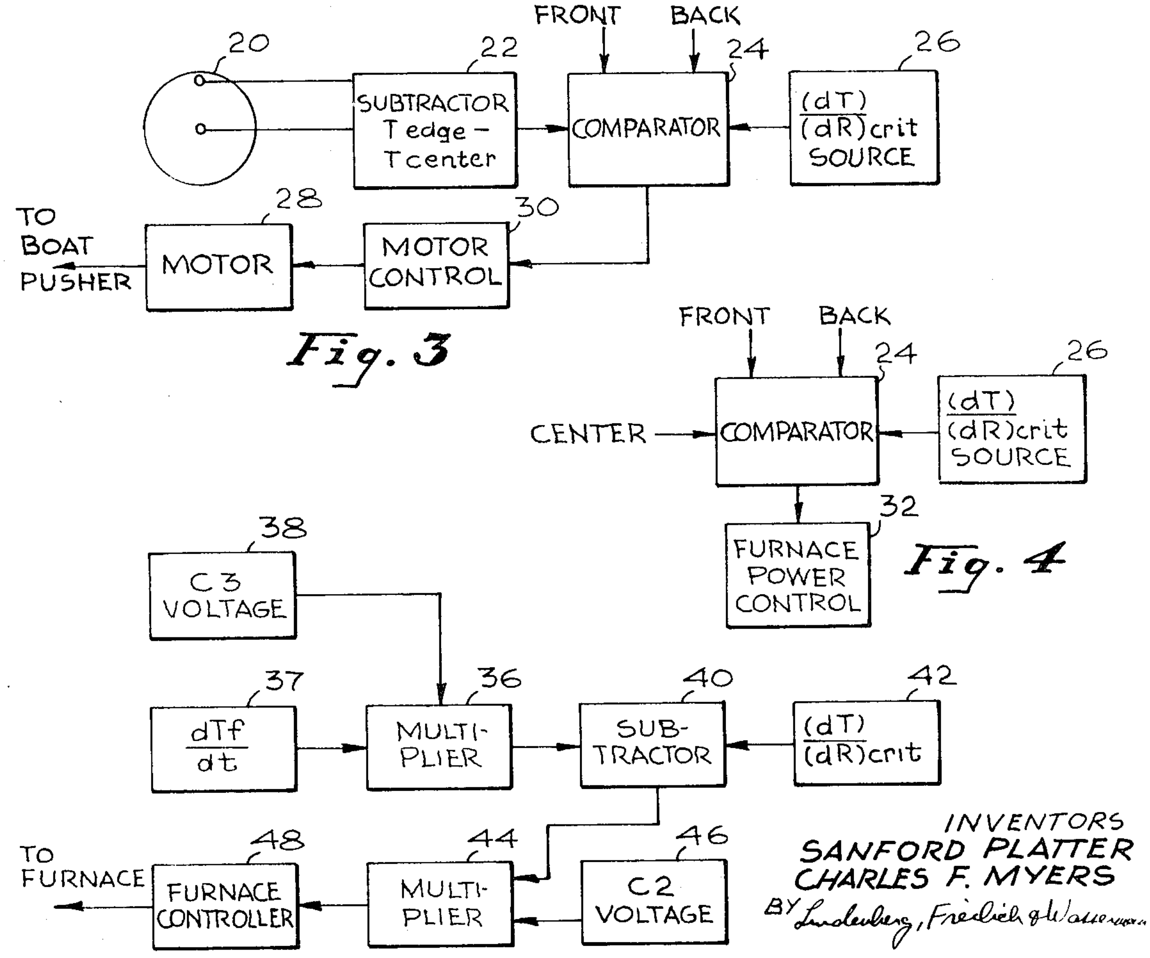
FIG. 3 is a schematic diagram illustrating a feedback velocity control system for heating semiconductor wafers without thermal stress.
FIG. 4 is a schematic diagram of a furnace temperature feedback control system for heating semiconductor wafers without thermal stress.
FIG. 5 is a schematic diagram of another furnace temperature feedback control system for heating semiconductor wafers without thermal stress.

This control may be done in arrangements such as is shown in FIG. 3, which is a schematic feedback control system. Voltages derived from the edge and from the center of the wafer 20 are applied to a subtractor circuit 22 which subtracts one of the voltages from the other. The output of the subtractor circuit, which is a voltage representative of $(dT)/(dR)$ is applied to a comparator 24 to be compared with a voltage provided by a voltage source 26, which is representative of $dT/dR$ crit. As the voltage output of the comparator gets smaller the speed of the boat moving motor 28, as determined by a motor control circuit 30 is increased. As the difference voltage output of the comparator, which is applied to the motor control decreases, the speed of the motor can be increased, in order to maintain $(dT)/(dR)$ at a value below the critical value. The other two inputs to the comparator may be received from a front and back wafer in the boat, assuming that the wafer 20 is in the center. The comparator may be made to produce a time shared output between the three inputs from the wafers and the standard critical input alternatively, the three inputs may be applied to a circuit which is well known, which permits only the maximum signal of the three inputs to be compared with the critical voltage source.

The temperature of the furnace may be controlled so that the boat, after first being heated to a temperature just below the plastic temperature is placed in the furnace whose temperature is then increased with time such that $dT/dt$ is low enough so that the rate of temperature change within the material $(dT)/(dR)$crit is not exceeded. Of course the steps should be reversed for cool down. This arrangement for increasing the furnace temperature may be achieved by increasing the furnace temperature at a constant rate and then decreasing it at a constant rate.

Alternative to the foregoing, the power to the furnace may be controlled by an arrangement such as shown in FIG. 4, wherein the input to the comparator 24 is the same as was described, namely from the two ends in the center of a boat as well as from the critical temperature change voltage source. The output of the comparator 24 is applied to a furnace power control 32. As the comparator output begins to decrease towards some minimal value (not zero) the furnace power control reduces the furnace power so that the furnace temperature is reduced or maintained or increased as required in response to the output of the comparator. The power to the furnace $W$ is maintained so that $W = C_2\,[\,(dT)/(dR)\text{crit} - dT/dR]$— where $C_2$ is a furnace constant.

Still another arrangement for maintaining the increase in temperature of the wafer material below the critical value above its plastic deformation point is to measure the temperature of the furnace instead of the temperature of the wafer and to control the power to the furnace ($W$) such that $W = C_2\,[\,(dT)/(dR)\text{crit} - C_3\, dT_f/dt\,]$ where $C_2$ and $C_3$ are furnace constants. The change of the furnace temperature with respect to time is a measurable value and the arrangement may be set up in an analog fashion as shown in FIG. 5. The voltage derived from furnace temperature sensing equipment 34, representative of $dT_f/dt$ is applied to a multiplier circuit 36, which also has applied thereto a voltage representative of the constant $C_3$(38). The output of the multiplier is applied to a subtractor 40, whose other input is a voltage representative of $dT/dR$crit, as represented by the rectangle 42.

The output of the subtractor 40 is applied to another multiplier circuit 42, having as its second input a voltage representative of $C_2$, which is provided by a $C_2$ voltage standard 46. the output of the multiplier is applied to the furnace controller 48.

There has accordingly been described hereinabove a novel method and means for preventing crystal damage arising in the heat processing of semiconductor material which leads to dislocations and pipe defects. Use of the novel techniques described herein have led to an improvement in yields from about 3 percent to the range from 28 to 45 percent.

What is claimed is:

1. A method of heat treating a semiconductor material for the purpose of avoiding dislocations comprising:

increasing the temperature of said semiconductor material above the plastic deformation temperature of said semiconductor material, at a rate below the critical thermal stress rate for said material.

2. A method of heating semiconductor wafers which are moved through a diffusion furnace in a manner to prevent dislocation caused by thermal stress comprising:

spacing said wafers apart from one another in said boat a distance required for enabling said wafers to be heated through their sides, maintaining said furnace temperature as said wafers are moved therethrough at a value such that the rate of change of temperature through said semiconductor material does not exceed the critical value above the plastic deformation temperature of said material.

3. A method of preventing dislocations in semiconductor wafers which are loaded on edge in a boat and then are moved through a diffusion furnace to be heat treated thereby comprising:

heating the wafers to a temperature just below the plastic deformation temperature, moving the semiconductors through the processing zone of the furnace which has a temperature in excess of a plastic deformation temperature at a speed such that the rate of change of temperature in the material of the semiconductors does not exceed the rate which causes thermal stress in said material.

4. A method as recited in claim 3 wherein the semiconductor wafers are moved through the furnace at a velocity which matches the temperature profile of the furnace.

5. The method as recited in claim 3 wherein the temperature gradient between the center and the edge of the semiconductor wafers in said boat are measured as said boat passes through said furnace to produce a temperature differential value, comparing the temperature differential value with a critical temperature differential value to provide a control voltage, and controlling the velocity of the motion of said semiconductor material through said furnace responsive to said control voltage to maintain said temperature differential below said critical temperature differential value.

6. The method as recited in claim 3 wherein the temperature gradient between the center and edge of the semiconductor wafers in said boat are measured as said boat passes through said furnace to produce a temperature differential value, comparing the temperature differential value with a critical temperature differential value to establish a control voltage, and controlling the power applied for heating said furnace for changing the furnace temperature at a value which maintains said temperature differential below said critical temperature differential value.

7. A method of preventing dislocations in semiconductor wafers which are loaded on edge in a boat and then are moved through a diffusion furnace to be heat treated thereby comprising:

heating said semiconductor wafers to a temperature below the temperature at which plastic deformation of said semiconductor wafer material occurs, measuring the temperature of said furnace, controlling the power applied for heating said furnace for changing the furnace temperature at a value which does not cause thermal stresses to occur in said semiconductor wafers.

* * * * *